United States Patent
Lin

(10) Patent No.: US 9,166,125 B2
(45) Date of Patent: Oct. 20, 2015

(54) COMPREHENSIVE LIGHT-EMITTING DIODE DEVICE AND LIGHTING-MODULE

(71) Applicant: Lextar Electronics Corporation, Hsinchu (TW)

(72) Inventor: Su-Hon Lin, Keelung (TW)

(73) Assignee: Lextar Electronics Corporation, Hsinchu (TW)

(*) Notice: Subject to any disclaimer, the term of this patent is extended or adjusted under 35 U.S.C. 154(b) by 0 days.

(21) Appl. No.: 14/326,905

(22) Filed: Jul. 9, 2014

(65) Prior Publication Data

US 2015/0255689 A1    Sep. 10, 2015

(30) Foreign Application Priority Data

Mar. 6, 2014    (TW) .............................. 103107630 A

(51) Int. Cl.
| | |
|---|---|
| H01L 33/00 | (2010.01) |
| H01L 25/00 | (2006.01) |
| H01L 33/50 | (2010.01) |
| H01L 33/60 | (2010.01) |
| H01L 25/075 | (2006.01) |

(52) U.S. Cl.
CPC .......... *H01L 33/507* (2013.01); *H01L 25/0753* (2013.01); *H01L 33/60* (2013.01)

(58) Field of Classification Search
CPC ... H01L 25/0753; H01L 25/075; H01L 25/13; H01L 33/507; H01L 33/60; H01L 33/505
See application file for complete search history.

(56) References Cited

U.S. PATENT DOCUMENTS 8,148,196 B2    4/2012    Hsieh

FOREIGN PATENT DOCUMENTS

| JP | 2001-210874 | * | 8/2001 | .............. H01L 33/00 |
| JP | 2004-134633 | * | 4/2004 | .............. H01S 5/193 |

* cited by examiner

*Primary Examiner* — Nikolay Yushin
(74) *Attorney, Agent, or Firm* — Hayes Soloway PC

(57) ABSTRACT

A comprehensive light-emitting diode device including a translucent substrate, a light-emitting diode chip, a reflective layer, a first wavelength conversion layer, and a second wavelength conversion layer. The translucent substrate includes a first surface and a second surface opposite to the first surface. The light-emitting diode chip is disposed on the first surface. The reflective layer is disposed on the first surface. The light-emitting diode chip is surrounded by the reflective layer. The first wavelength conversion layer is disposed on the first surface. The light-emitting diode chip and the reflective layer are covered by the first wavelength conversion layer.

9 Claims, 5 Drawing Sheets

COMPREHENSIVE LIGHT-EMITTING DIODE DEVICE AND LIGHTING-MODULE

RELATED APPLICATIONS

This application claims priority to Taiwan Application Serial Number 103107630, filed Mar. 6, 2014, which is herein incorporated by reference.

BACKGROUND

1. Technical Field

The present disclosure relates to a lighting-module. More particularly, the present disclosure relates to a lighting-module including a comprehensive light-emitting diode device.

2. Description of Related Art

Chip-on-glass technology is a method to fix a light-emitting diode chip onto a transparent glass substrate. However, side-directional light emitted by the light-emitting diode chip can pass through the transparent glass substrate, and may result in the leakage of blue light. Consequently, products of chip-on-glass technology have deficiency in how they emit light, thus consumers tend to stay away from this product.

SUMMARY

The disclosure provides a comprehensive light-emitting diode device including a translucent substrate, a light-emitting diode chip, a reflective layer, a first wavelength conversion layer, and a second wavelength conversion layer. The translucent substrate includes a first surface and a second surface opposite to the first surface. The light-emitting diode chip is disposed on the first surface. The reflective layer is disposed on the first surface. The light-emitting diode chip is surrounded by the reflective layer. The first wavelength conversion layer is disposed on the first surface. The light-emitting diode chip and the reflective layer are covered by the first wavelength conversion layer. The second wavelength conversion layer is disposed on the second surface. The vertical projection of the light-emitting diode chip is located in an area of the second wavelength conversion layer.

In an embodiment of the present disclosure, the light-emitting diode chip has a first height relative to the first surface, the reflective layer has a second height relative to the first surface, and the first height is greater than the second height.

In an embodiment of the present disclosure, a distance between the light-emitting diode chip and the reflective layer is 50 to 100 µm.

In an embodiment of the present disclosure, the first wavelength conversion layer is an encapsulant including a wavelength conversion material.

In an embodiment of the present disclosure, the wavelength conversion material is a fluorescent powder, a pigment, a dyeware, or a combination thereof.

The present disclosure further provides a lighting module including a translucent substrate, a plurality of light-emitting diode chips, at least one reflective layer, a first wavelength conversion layer, a second wavelength conversion layer, a first electrode, and a second electrode. The translucent substrate includes a first surface and a second surface opposite to the first surface. The light-emitting diode chips are disposed on the first surface. The reflective layer is disposed on the first surface, and the light-emitting diode chips are surrounded by the reflective layer. The first wavelength conversion layer is disposed on the first surface. The light-emitting diode chips and the reflective layer are covered by the first wavelength conversion layer. The second wavelength conversion layer is disposed on the second surface. A vertical projection of each of the light-emitting diode chips is located in an area of the second wavelength conversion layer. The first electrode is disposed on the first surface and is electrically connected with the light-emitting diode chips. The second electrode is disposed on the first surface and is electrically connected with the light-emitting diode chips.

In an embodiment of the present disclosure, each of the light-emitting diode chips has a first height relative to the first surface, the reflective layer has a second height relative to the first surface, and the first height is greater than the second height.

In an embodiment of the present disclosure, the number of the at least one reflective layer is plural, each of the reflective layers is ring-shaped, and each of the light-emitting diode chips is surrounded by the corresponding reflective layer.

In an embodiment of the present disclosure, a distance between each of the light-emitting diode chips and the corresponding reflective layer is 50 to 100 µm.

In an embodiment of the present disclosure, the reflective layer has a plurality of hollow portions, and each of the light-emitting diode chips is surrounded by the corresponding hollow portion.

In an embodiment of the present disclosure, a distance between each of the light-emitting diode chips and an inner edge of the corresponding hollow portion is 50 to 100 µm.

Accordingly, in the present disclosure, the comprehensive light-emitting diode device includes the translucent substrate, the light-emitting diode chip, the reflective layer, the first wavelength conversion layer, and the second wavelength conversion layer. The reflective layer can reflect the side-directional light projected by the light-emitting diode chip to become the forward-directional light to propagate into the first wavelength conversion layer. After which, the forward-directional light is converted into specific light by the first wavelength conversion layer. Because the side-directional light is reflected by the reflective layer, the side-directional light does not leak out of the edge of the translucent substrate. The comprehensive light-emitting diode device not only reflects the side-directional light to become the forward-directional light in order to increase the brightness, but also solves the problem of the leakage of the side-directional light.

It is to be understood that both the foregoing general description and the following detailed description are by example, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
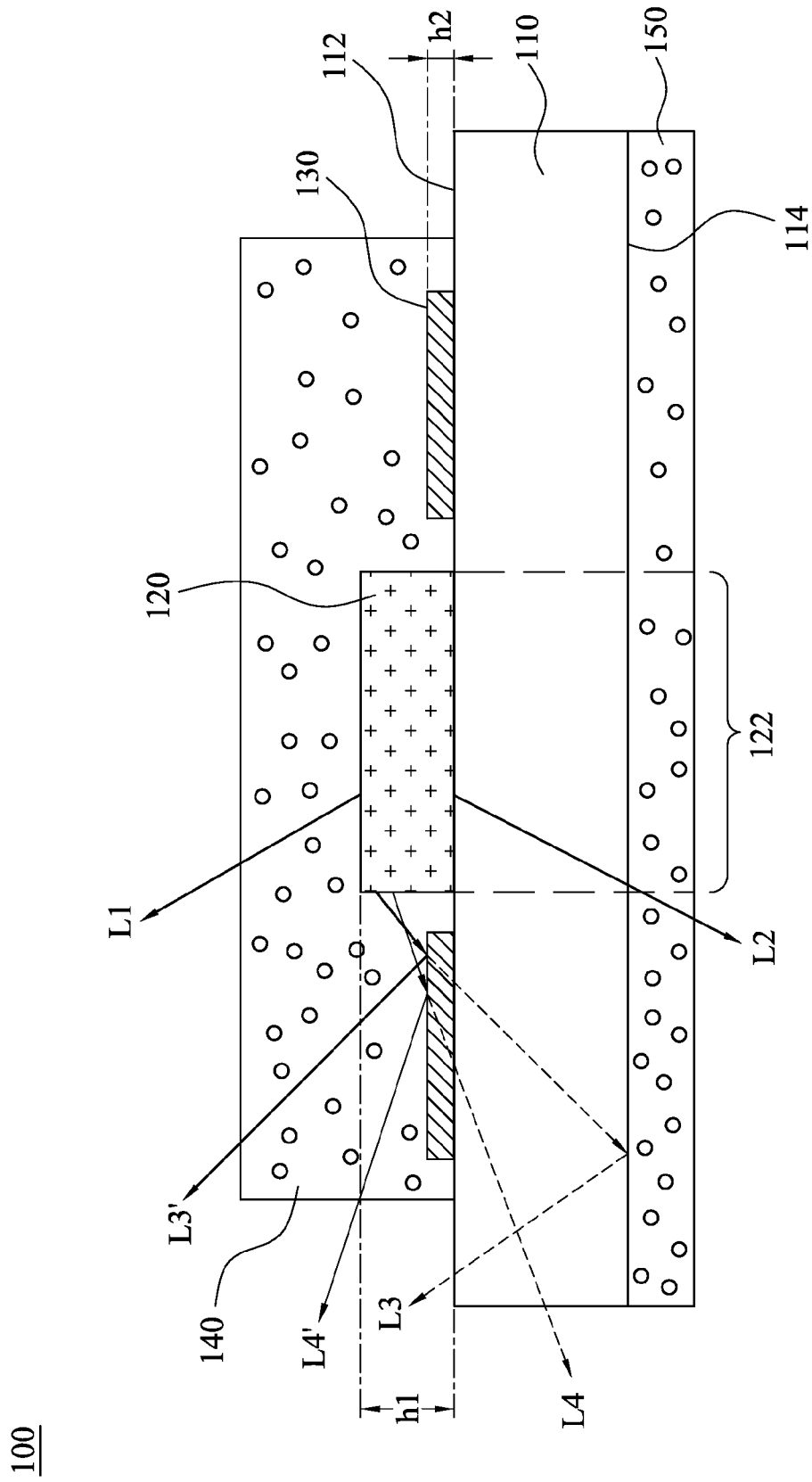
FIG. 1 is a schematic view of a comprehensive light-emitting diode device according to an embodiment of the present disclosure.

The present disclosure can be more fully understood by reading the following detailed description of the embodiment, with reference made to the accompanying drawings. Wherever possible, the same reference numbers are used in the drawings and the description to refer to the same or like parts. However, the embodiments are not provided to limit the scope covered in the present disclosure, and the description of the operation of the structures is not intended to limit the order in which to perform, any structure formed by re-combination of the elements that result in a device with equal effect are all covered in the scope of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
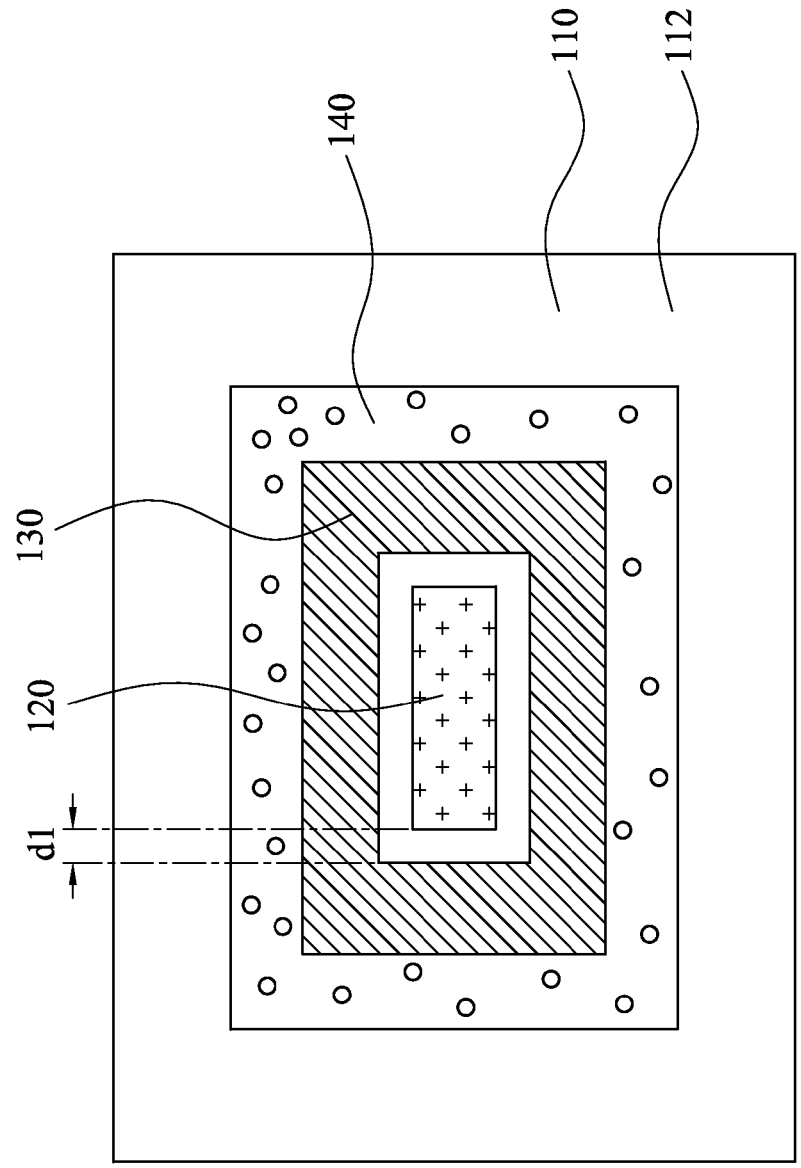
FIG. 2 is a top view of the comprehensive light-emitting diode device in FIG. 1.

In order to solve the problem in which a conventional lighting module leaks blue light, the present disclosure provides a comprehensive light-emitting diode device that is able to effectively solve the problem. FIG. 1 is a schematic view of a comprehensive light-emitting diode device 100 according to an embodiment of the present disclosure. FIG. 2 is a top view of the comprehensive light-emitting diode device 100 in FIG. 1. The comprehensive light-emitting diode device 100 includes a translucent substrate 110, a light-emitting diode chip 120, a reflective layer 130, a first wavelength conversion layer 140 and a second wavelength conversion layer 150. The translucent substrate 110 has a first side 112 and a second side 114 opposite to the first side 112. The light-emitting diode chip 120 is disposed on the first side 112. The reflective layer 130 is disposed on the first side 112, and the light-emitting diode chip 120 is surrounded by the reflective layer 130. The first wavelength conversion layer 140 is disposed on the first side 112, and the light-emitting diode chip 120 and the reflective layer 130 are covered by the first wavelength conversion layer 140. The second wavelength conversion layer 150 is disposed on the second side 114. A vertical projection 122 of the light-emitting diode chip 120 is located in an area of the second wavelength conversion layer 150.

In this embodiment, the light-emitting diode chip 120 has a first height h1 relative to the first side 112, the reflective layer 130 has a second height h2 relative to the first side 112, and the first height h1 is greater than the second height h2. In this embodiment, a distance d1 between the light-emitting diode chip 120 and the reflective layer 130 is 50 μm to 100 μm. In this embodiment, the first wavelength conversion layer 140 is an encapsulant including a wavelength conversion material. In this embodiment, the wavelength conversion material is a fluorescent powder, a pigment, a dyeware or a combination thereof.

A forward-directional light L1 projected by the light-emitting diode chip 120 is converted into specific light (e.g., white light) after passing through the first wavelength conversion layer 140. A back-directional light L2 projected by the light-emitting diode chip 120 is converted into specific light after passing through the second wavelength conversion layer 150. The back-directional light L2 is weaker than the side-directional light L3 or the side-directional light L4, and propagates into the second wavelength conversion layer 150 more easily so as to be convert into specific light with regard to the angle of incidence of the back-directional light L2, which is in a parallel direction. Therefore, the back-directional light L2 does not leak in practical usage.

The conventional light-emitting diode chip does not include the reflective layer 130. Therefore, the side-directional light L3 or the side-directional light L4 can propagate into the translucent substrate 110. The side-directional light L4 can leak out of an edge of the translucent substrate 110. The side-directional light L3 may be reflected by the second wavelength conversion layer 150 and leaks out of the edge of the translucent substrate 110. Because the side-directional light L3 or the side-directional light L4 which may leaked out is not converted by wavelength conversion layer, the color (e.g., blue) may not be acceptable to consumers. In the present disclosure, the side-directional light L3' or the side-directional light L4' projected by the light-emitting diode chip 120 is reflected by the reflective layer 130 and propagates into the first wavelength conversion layer 140 to be converted into specific light. The comprehensive light-emitting diode device 100 can reflect a side-directional light into a forward-directional light in order to increase the brightness, and this method solves the leaking problem of the side-directional light as well.

Figure 3:
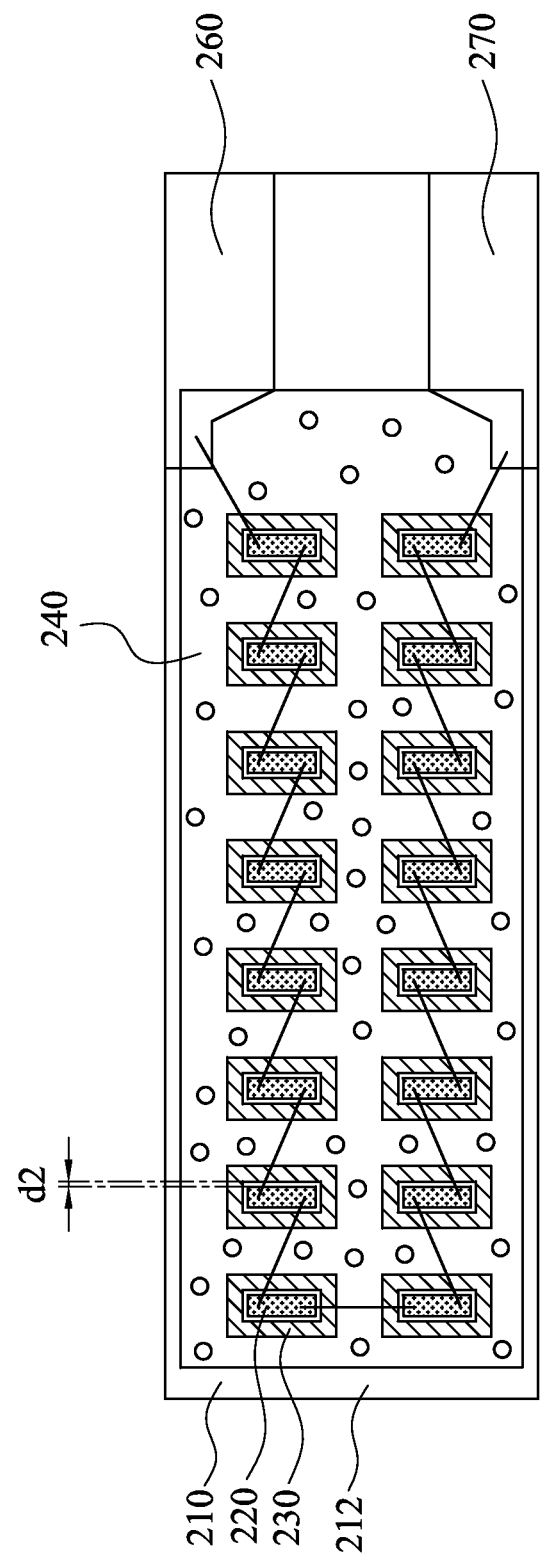
FIG. 3 is a schematic top view of a lighting module according to an embodiment of the present disclosure.
Figure 4:
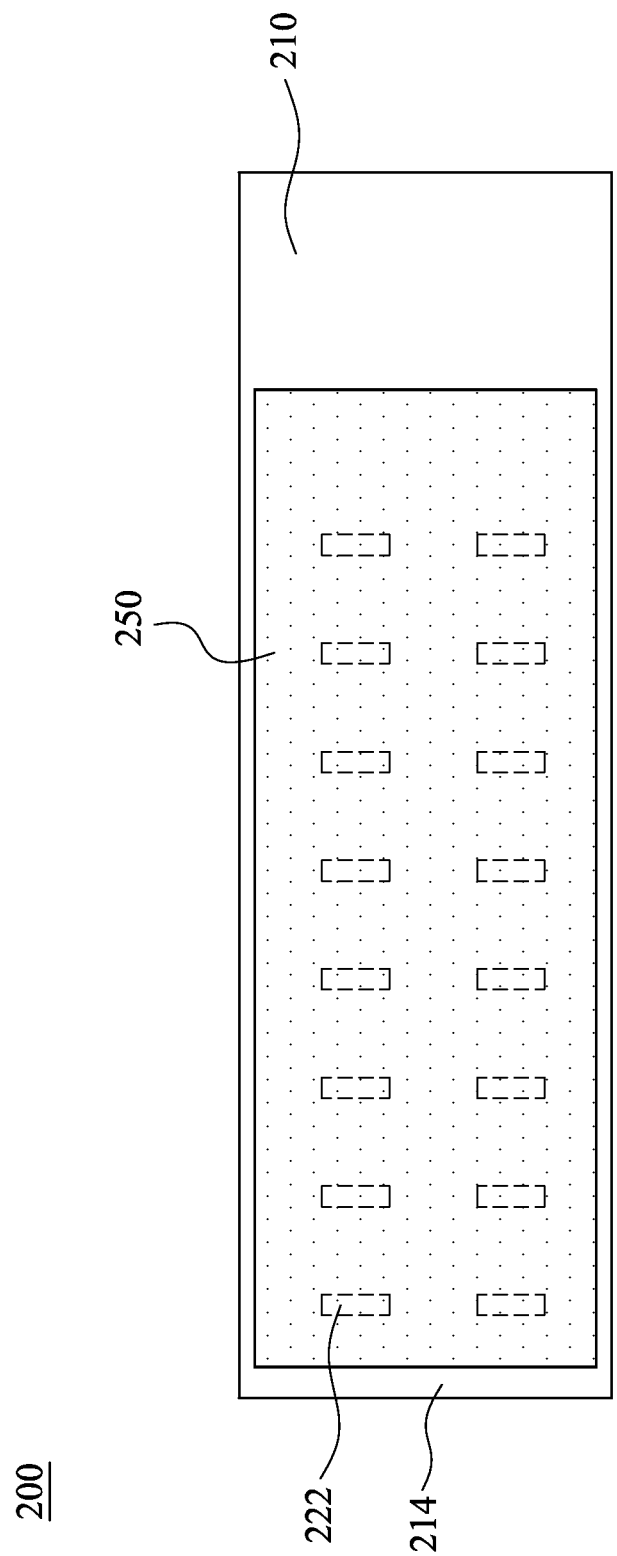
FIG. 4 is a bottom view of the lighting module in FIG. 3.

FIG. 3 is a schematic top view of a lighting module 200 according to an embodiment of the present disclosure. FIG. 4 is a bottom view of the lighting module 200 in FIG. 3. The present disclosure provides the lighting module 200 including a translucent substrate 210, a plurality of light-emitting diode chips 220, at least one reflective layer 230, a first wavelength conversion layer 240, a second wavelength conversion layer 250, a first electrode 260 and a second electrode 270. The translucent substrate 210 has a first side 212 and a second side 214 opposite to the first side 212. Each of the light-emitting diode chips 220 is disposed on the first side 212. The reflective layer 230 is disposed on the first side 212, and each of the light-emitting diode chips 220 is surrounded by the reflective layer 230. The first wavelength conversion layer 240 is disposed on the first side 212, and the light-emitting diode chips 220 and the reflective layer 230 are covered by the first wavelength conversion layer 240. The second wavelength conversion layer 250 is disposed on the second side 214. A vertical projection 222 of each of the light-emitting diode chips 220 is located in an area of the second wavelength conversion layer 250. The first electrode 260 is disposed on the first side 212 and is electrically connected with the light-emitting diode chips 220. The second electrode 270 is disposed on the first side 212 and is electrically connected with the light-emitting diode chips 220. In this embodiment, each of the light-emitting diode chips 220 has a first height relative to the first side 212, the reflective layer 230 has a second height relative to the first side 212, and the first height is greater than the second height (referring to the translucent substrate 110, the light-emitting diode chip 120, and the reflective layer 130 in FIG. 1).

In this embodiment, the number of the reflective layer 230 is plural. Each of the reflective layers 230 is ring-shaped, and each of the light-emitting diode chips 220 is surrounded by the corresponding reflective layers 230. In this embodiment, a distance d2 between each of the light-emitting diode chips 220 and the corresponding reflective layer 230 is 50 μm to 100 μm. In this embodiment, the reflective layer 230 is made of silver. When the reflective layer 230 is plural (comparing to the embodiment of FIG. 5), the coating area is smaller so as to save the material of the reflective layer 230.

People having ordinary skill in the art can make proper modification to the number of the light-emitting diode chips 220 and the reflective layer 230 according to their actual needs.

Figure 5:
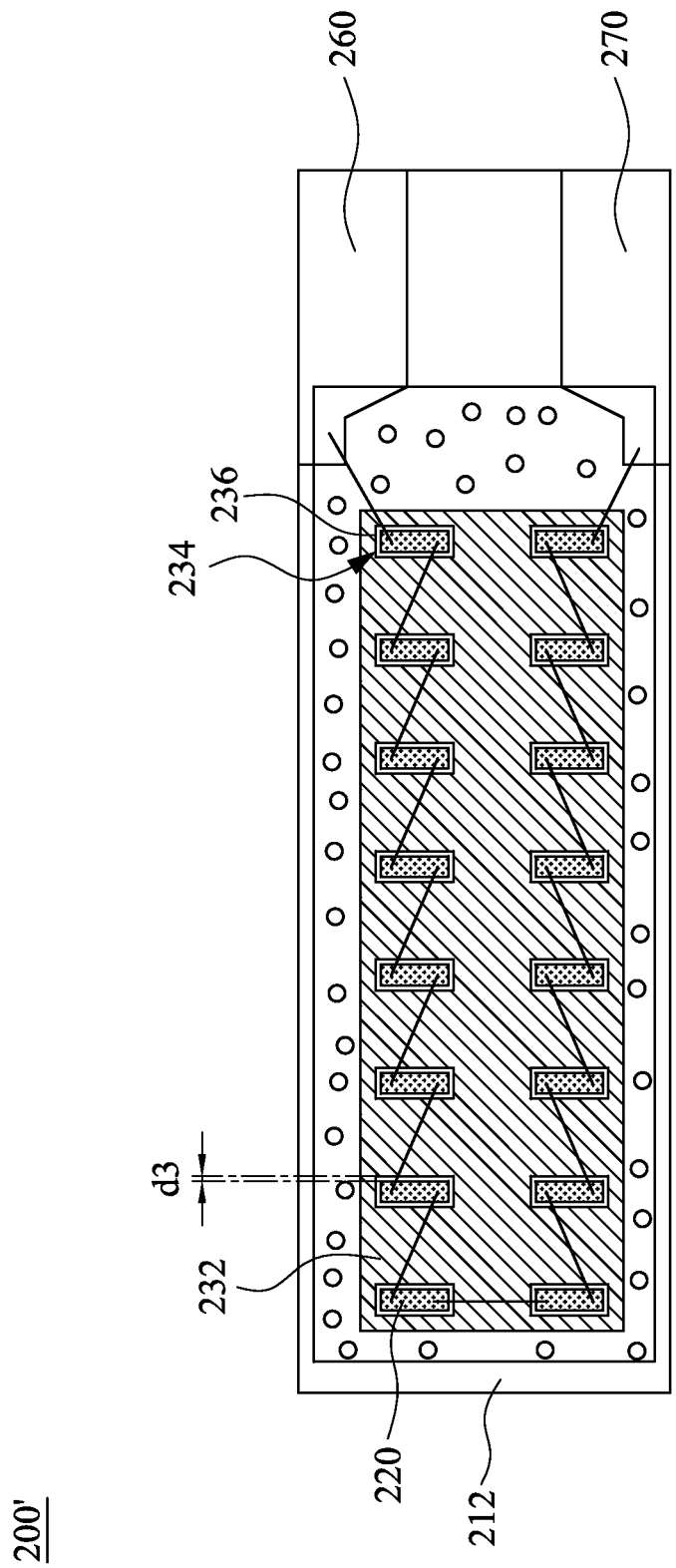
FIG. 5 is a schematic top view of a lighting module according to another embodiment of the present disclosure.

FIG. 5 is a schematic top view of a lighting module 220' according to another embodiment of the present disclosure. In this embodiment, the number of the reflective layer 232 is one. The reflective layer 232 has a plurality of hollow portions 234, and each of the light-emitting diode chips 220 is surrounded by the corresponding hollow portions 234. In this embodiment, a distance d3 between each of the light-emitting diode chips 220 and an inner edge 236 of the corresponding hollow portion 234 is 50 μm to 100 μm. When the number of the reflective layer 232 is one (comparing to the embodiment of FIG. 3), the coating area is wider, thus the ability to prevent leaking is better.

People having ordinary skill in the art can make proper modification to the number of the light-emitting diode chips 220 and the hollow portion 234 according to their actual needs.

In this embodiment, the light-emitting diode chips 220, the first electrode 260, and the second electrode 270 are electrically connected in series. The light-emitting diode chips 220, the first electrode 260, and the second electrode 270 can be electrically connected in parallel as well. Connecting in series is more convenient and reduces the costs of producing. The advantage of connecting in parallel is that: if one of the light-emitting diode chips 220 is destroyed, the other light-emitting diode chips 220 can still function normally.

Accordingly, in the present disclosure, the comprehensive light-emitting diode device includes the translucent substrate, the light-emitting diode chip, the reflective layer, the first wavelength conversion layer, and the second wavelength conversion layer. The reflective layer can reflect the side-directional light projected by the light-emitting diode chip to become the forward-directional light to propagate into the first wavelength conversion layer. After which, the forward-directional light is converted into specific light by the first wavelength conversion layer. Because the side-directional light is reflected by the reflective layer, the side-directional light does not leak out of the edge of the translucent substrate. The comprehensive light-emitting diode device not only reflects the side-directional light to become the forward-directional light in order to increase the brightness, but also solves the problem of the leakage of the side-directional light.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A comprehensive light-emitting diode device, comprising:
   a translucent substrate comprising a first surface and a second surface opposite to the first surface;
   a light-emitting diode chip disposed on the first surface;
   a reflective layer disposed on the first surface and the light-emitting diode chip being surrounded by the reflective layer, wherein a distance between the light-emitting diode chip and the reflective layer is 50 to 100 μm;
   a first wavelength conversion layer disposed on the first surface, and the light-emitting diode chip and the reflective layer being covered by the first wavelength conversion layer; and
   a second wavelength conversion layer disposed on the second surface, wherein a vertical projection of the light-emitting diode chip is located in an area of the second wavelength conversion layer.

2. The comprehensive light-emitting diode device of claim 1, wherein the light-emitting diode chip has a first height relative to the first surface, the reflective layer has a second height relative to the first surface, and the first height is greater than the second height.

3. The comprehensive light-emitting diode device of claim 1, wherein the first wavelength conversion layer is an encapsulant comprising a wavelength conversion material.

4. The comprehensive light-emitting diode device of claim 3, wherein the wavelength conversion material is selected from the groups consisting of a fluorescent powder, a pigment, a dyeware, and combinations thereof.

5. A lighting module, comprising:
   a translucent substrate comprising a first surface and a second surface opposite to the first surface;
   a plurality of light-emitting diode chips disposed on the first surface;
   a plurality of reflective layers disposed on the first surface, wherein each of the reflective layers is ring-shaped, and each of the light-emitting diode chips is surrounded by the corresponding reflective layer;
   a first wavelength conversion layer disposed on the first surface, and the light-emitting diode chips and the reflective layer being covered by the first wavelength conversion layer;
   a second wavelength conversion layer disposed on the second surface, wherein a vertical projection of each of the light-emitting diode chips is located in an area of the second wavelength conversion layer;
   a first electrode disposed on the first surface and electrically connected with the light-emitting diode chips; and
   a second electrode disposed on the first surface and electrically connected with the light-emitting diode chips.

6. The lighting module of claim 5, wherein a distance between each of the light-emitting diode chips and the corresponding reflective layer is 50 to 100 μm.

7. The lighting module of claim 5, wherein each of the light-emitting diode chips has a first height relative to the first surface, the reflective layer has a second height relative to the first surface, and the first height is greater than the second height.

8. The lighting module of claim 7, wherein the reflective layer has a plurality of hollow portions, and each of the light-emitting diode chips is surrounded by the corresponding hollow portion.

9. The lighting module of claim 8, wherein a distance between each of the light-emitting diode chips and an inner edge of the corresponding hollow portion is 50 to 100 μm.

* * * * *